United States Patent [19]

Baseghi

[11] Patent Number: 4,980,849
[45] Date of Patent: Dec. 25, 1990

[54] METHOD AND APPARATUS FOR AUTOREGRESSIVE MODEL SIMULATION

[75] Inventor: Behshad Baseghi, Santa Barbara, Calif.

[73] Assignee: Raytheon Company, Lexington, Mass.

[21] Appl. No.: 316,616

[22] Filed: Feb. 28, 1989

[51] Int. Cl.$^5$ ............................................. G06F 15/31
[52] U.S. Cl. ........................... 364/724.17; 364/724.13
[58] Field of Search .................. 364/724.01, 724.13, 364/724.17, 724.06, 724.08, 724.09, 718–721

[56] References Cited

U.S. PATENT DOCUMENTS

| | | | |
|---|---|---|---|
| 3,993,890 | 11/1976 | Peled et al. | 364/724.17 |
| 4,146,931 | 3/1979 | Delforge | 364/724.17 |
| 4,286,326 | 8/1981 | Houdard | 364/724.08 |
| 4,305,133 | 12/1981 | Amada et al. | 364/724.17 |
| 4,337,518 | 6/1982 | Ohnishi et al. | 364/724.17 |
| 4,398,262 | 8/1983 | Williams | 364/724.13 |
| 4,561,065 | 12/1985 | Matsuda | 364/724.17 |
| 4,740,894 | 4/1988 | Lyon | 364/724.16 |
| 4,766,561 | 8/1988 | Thompson et al. | 364/724.13 |
| 4,794,556 | 12/1988 | Rader | 364/724.17 |
| 4,811,263 | 3/1989 | Hedley et al. | 364/724.17 |

Primary Examiner—Dale M. Shaw
Attorney, Agent, or Firm—Edmund J. Walsh; Richard M. Sharkansky

[57] ABSTRACT

An autoregressive model simulator is disclosed. The simulator produces time multiplexed samples of a plurality of signals generated from autoregressive coefficients. The order of the autoregressive model is selected by the configuration of identical integrated circuit chips. The autoregressive coefficients for each signal and past samples of the signal are rotated through FIFOs in a manner which enables the simulator to be simply controlled.

8 Claims, 5 Drawing Sheets

METHOD AND APPARATUS FOR AUTOREGRESSIVE MODEL SIMULATION

BACKGROUND OF THE INVENTION

This invention relates generally to the formation of signals having desired statistical characteristics and more particularly to a design for an integrated circuit chip to produce signals using an autoregressive model.

In various situations, it is desirable to produce an electrical signal or set of electrical signals having a particular frequency spectrum. One technique for producing signals with a desired spectrum is to use what is called an autoregressive model. With this technique, the signal is described in terms of autoregressive coefficients.

To produce a sample of the desired signal, the autoregressive coefficients are combined in a known fashion. The combination of these coefficients is described by an equation:

$$y(N) = \sum_{q=1}^{M} (a_q y(N-q)) + bX(N) \qquad \text{Eq. 1}$$

where
$y(N)$ is the Nth, and current, sample of the generated signal;
q is an index of summation;
$y(N-q)$ is a sample of the generated signal generated q samples before the current sample (for values of $(N-q)$ less than zero, $y(N-q)$ is defined to be zero);
$a_q$ is the qth autoregressive coefficient characterizing the desired signal;
b is a constant also determined as part of the calculation of autoregressive coefficients;
$X(N)$ is the Nth sample of a function representing zero mean white noise with a unit variance; and
M is a constant representing the order of the autoregressive model.

The order of the autoregressive model, M, dictates how closely the spectrum of the generated signal approximates the desired spectrum. The higher the value of M, the closer the approximation. It should be noted, however, that the higher the value of M, the more autoregressive coefficients are required to evaluate Eq. 1. Since the signal is generated by some form of electronic circuitry, more coefficients generally require larger or more complicated circuitry.

The circuitry used to form the signal is called an "autoregressive model simulator". It is desirable for an autoregressive model simulator to be easily constructed, regardless of the order of the model. In some applications, it is desirable to generate several signals simultaneously. Thus, it would be desirable to have circuitry that could generate a plurality of signals.

SUMMARY OF THE INVENTION

With the foregoing background in mind, it is therefore an object of this invention to provide a simple circuit for implementing an autoregressive model simulator.

It is also an object of this invention to provide a simple circuit for an autoregressive model simulator capable of generating a plurality of signals.

It is yet another object of this invention to provide a design for an integrated circuit chip from which an autoregressive model simulator of any order can be constructed.

The foregoing and other objects of this invention are accomplished by an autoregressive model simulator constructed from a plurality of identical circuit elements. Each circuit element comprises a plurality of multipliers. The inputs to the multipliers are coupled to first in first out FIFO memories storing a set of autoregressive coefficients and past samples for each signal to be generated. The outputs of the multipliers are summed by adder elements. The sum is combined in an adder/subtractor with an external input representing a random signal.

In operation, the value at the top of each coefficient FIFO is moved to the bottom of the same FIFO after one sample of each output signal is computed. The value at the top of each FIFO storing past samples, except the last, is moved to the bottom of an adjacent FIFO. The simulator is thereby operated to ensure that the coefficients and the corresponding past samples for each signal are simultaneously at the tops of all the FIFOs.

BRIEF DESCRIPTION OF THE DRAWINGS

With the foregoing object of the invention in mind, the invention may be better understood by reference to the following detailed description and the accompanying drawings in which.

DESCRIPTION OF THE PREFERRED EMBODIMENTS

Figure 1:
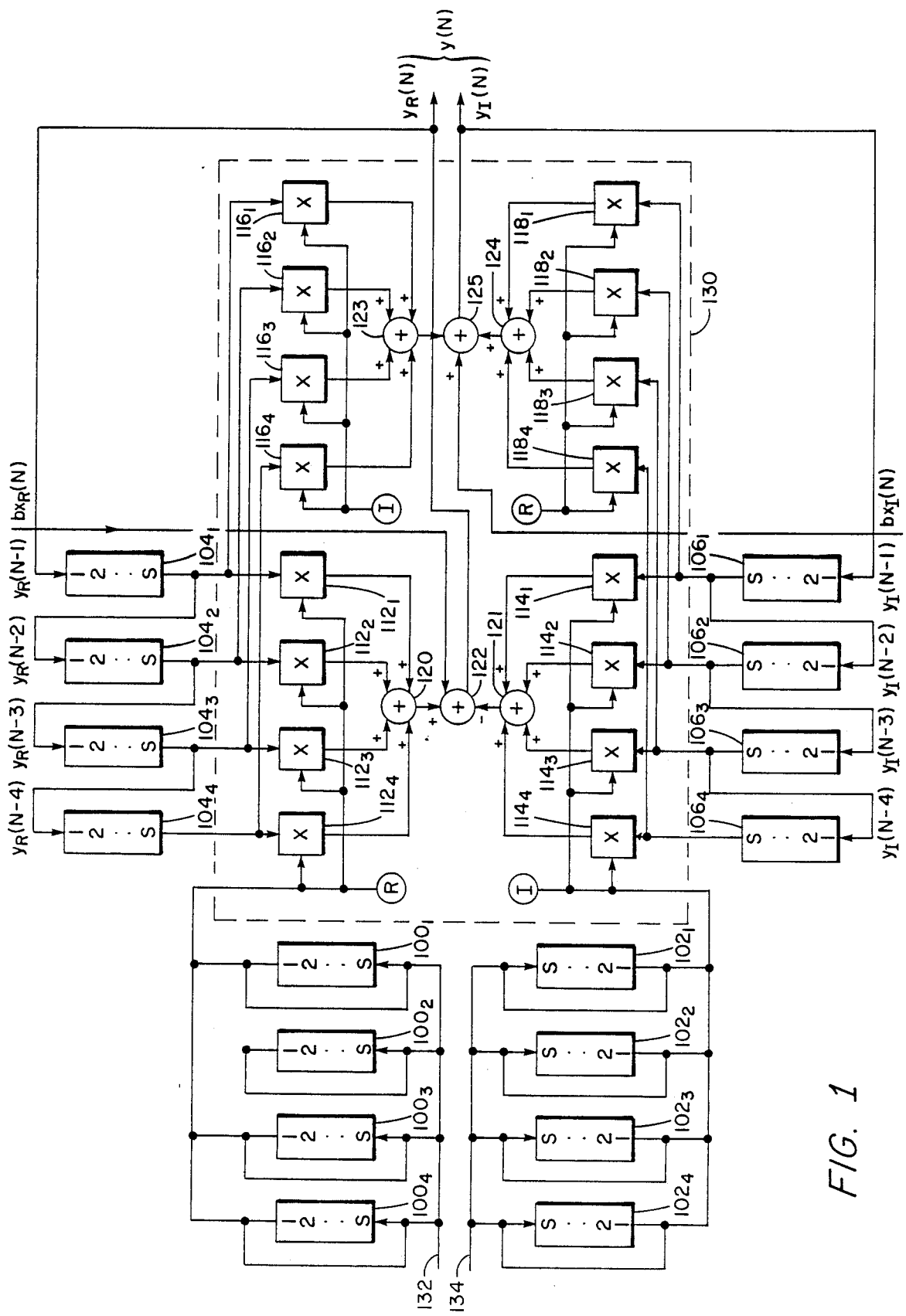
FIG. 1 is a block diagram of a fourth order autoregressive model simulator constructed according to the present invention.

FIG. 1 shows a block diagram of a fourth order autoregressive model simulator. As shown by Eq. 1, the autoregressive model simulator produces samples of a signal $y(N)$ as N takes on values $0, 1, 2, 3 \ldots$.

In many applications, both the amplitude and phase of the signal $y(N)$ are important. Here, $y(N)$ consists of a real part $y_R(N)$ and an imaginary part $y_I(N)$ which together convey phase and amplitude information. Likewise, each autoregressive coefficient $a_q$ has a real part and an imaginary part $a_{qR}$ and $a_{qI}$, respectively. $X(n)$ also consists of a real and an imaginary part $X_R(N)$ and $X_I(N)$. Thus, $y(N) = y_R(N) + j y_I(N)$ and $a_q = a_{qR} + j a_{qI}$ and $X(N) = X_R(N) + j X_I(N)$. Equation 1 might therefore be written to describe the calculation of $y_R(N)$ and $y_I(N)$:

$$y_R(N) = \sum_{q=1}^{M} (a_{qR} y_R(N-q)) - \sum_{q=1}^{M} (a_{qI} y_I(N-q)) + bX_R(N) \qquad \text{Eq. 2a}$$

-continued
$$y_I(N) = \sum_{q=1}^{M} (a_{qI} y_R(N - q)) + \sum_{q=1}^{M} (a_{qR} y_I(N - q)) + bX_I(N) \quad \text{Eq. 2b}$$

The block diagram of FIG. 1 shows a circuit which implements Eqs. 2a and 2b. Values of $bX_I(N)$ and $bX_R(N)$ are provided as inputs to the circuit. Memories $100_1 \ldots 100_4$ store the real parts of the autoregressive coefficients, $a_{qR}$, for q taking on values 1 ... 4, respectively. Memories $102_1 \ldots 102_4$ store the imaginary parts of the autoregressive coefficients, $a_{qI}$, for q taking on values 1...4, respectively. Memories $104_1 \ldots 104_4$ store the real part of $y(N-q)$, $y_R(N-q)$, for q taking on values 1...4, respectively. Memories $106_1 \ldots 106_4$ store the imaginary part of $y(N-q)$, $y_I(N-q)$ for q taking on values 1 ... q, respectively.

Adder 120 computes the first summation term of Eq. 2a. Multipliers $112_1 \ldots 112_4$ multiply the values in memories $100_1 \ldots 100_4$ by the values in memories $104_1 \ldots 104_4$, respectively. Thus, each multiplier $112_1 \ldots 112_4$ computes one term $a_{qR} y_R (N-q)$ for q taking on values 1 ... 4. The output of the multipliers $112_1 \ldots 112_4$ are summed by adder 120.

Adder 121 computes the second summation term of Eq. 2a. Multipliers $114_1 \ldots 114_4$ multiply the values in memories $102_1 \ldots 102_4$ by the values in memories $106_1 \ldots 106_4$, respectively. Thus, each multiplier $114_1 \ldots 114_4$ computes one term $a_{qI} y_I (N-q)$ for q taking on values 1 ... 4. The output of the multipliers $114_1 \ldots 114_4$ are summed by adder 121. The outputs of adders 120 and 121 are added by adder 122. The output of adder 121 is negated by adder 122 as indicated in Eq. 2a. The term $bX_R(N)$ provided as an input is also added by adder 122. Adder 122 adds all the terms in Eq. 2a. Thus, the output of adder 122 is $y_R(N)$.

Adder 123 computes the first summation term of Eq. 2b. Multipliers $116_1 \ldots 116_4$ multiply the values in memories $102_1 \ldots 102_4$ by the values in memories $104_1 \ldots 104_4$, respectively. The nodes labeled I are connected together, but the connection is not explicitly shown. Thus, each multiplier $116_1 \ldots 116_4$ computes one term $a_{qI} y_R (N-q)$ for q taking on values 1 ... 4. The output of the multipliers $116_1 \ldots 116_4$ are summed by adder 123.

Adder 124 computes the second summation term of Eq. 2b. Multipliers $118_1 \ldots 118_4$ multiply the values in memories $102_1 \ldots 102_4$ by the values in memories $106_1 \ldots 106_4$, respectively. The points labeled R are connected together, but the connection is not explicitly shown. Thus, each multiplier $118_1 \ldots 118_4$ computes one term $a_{qR} y_I (N-q)$ for q taking on values 1 ... 4. The output of the multipliers $118_1 \ldots 118_4$ are summed by adder 124.

The outputs of adders 123 and 124 are added by adder 125. The term $bX_I(N)$ provided as an input is also added by adder 125. Adder 125 adds all three terms of Eq. 2b. Thus, the output of adder 125 is $y_I(N)$.

Eq. 1 describes what is often called an "infinite impulse response" or "recursive" filter. The value of $y(N)$ produced for any value of N depends on the M preceeding values of $y(N)$. In FIG. 1, memories $104_1 \ldots 104_4$ are interconnected such that the M (here 4) preceding values of $y(N)$ are always stored. As seen in FIG. 1, when a new value of $y(N)$ is produced, the value of $Y_R(N)$ is stored in memory $104_1$, since that value will represent $y_R(N-1)$ when the next value of $y_R(N)$ is computed. The value stored in memory $104_1$, previously representing $y_R(N-1)$ becomes $y_R(N-2)$ and is moved to memory $104_2$. In this way, the values stored in memories $104_2$ and $104_3$ are "rippled down" each time the value of N increases. Thus, memories $104_1 \ldots 104_4$ store the appropriate values for $y_R(N-1) \ldots y_R(N-4)$. In a similar fashion, memories $106_1 \ldots 106_4$ store the appropriate values of $y_I(N-1) \ldots y_I(N-4)$.

An additional feature of the present invention may also be seen by reference to FIG. 1. As previously described, it is desirable for an autoregressive model simulator to produce a plurality of different signals. From Eq. 1, it can be seen that for each signal, a different set of autoregressive coefficients, $a_1 \ldots a_M$, a different set of past outputs $y(N-1) \ldots y(N-M)$ and a different value of $bX(N)$ is required. The computing circuitry 130 needed to implement Eq. 1 is otherwise the same.

The autoregressive model simulator of FIG. 1 is adapted to produce samples of S different signals. Memories $100_1 \ldots 100_4$ and $102_1 \ldots 102_4$ each contain S locations for storing S sets of autoregressive coefficients, one set for each signal to be generated. Memories $104_1 \ldots 104_4$ and $106_1 \ldots 106_4$ also have S locations for storing S sets of past values of $y(N)$.

In operation, computing circuitry 130 is time multiplexed to produce S different signals. For example, in a first time interval, memories $100_1 \ldots 100_4$ and $102_1 \ldots 102_4$ are operated to provide the autoregressive coefficients for a first signal. Simultaneously, memories $104_1 \ldots 104_4$ and $106_1 \ldots 106_4$ are operated to provide past samples of the first signal. In that first interval, then, the output $y(N)$ is the Nth sample of the first signal. In the next time interval, memories $100_1 \ldots 100_4$, $102_1 \ldots 102_4$, $104_1 \ldots 104_4$, and $106_1 \ldots 106_4$ are operated to provide values needed to compute the Nth sample of the second signal. The operation of the memories continues in this fashion for each of the subsequent time intervals until a sample is produced for each of the S signals. The cycle then starts over with each memory operated to produce the next sample of the first signal.

Memories $100_1 \ldots 100_4, 102_1 \ldots 102_4, 104_1 \ldots 104_4$, and $106_1 \ldots 106_4$ are here first in first out memories (FIFOs) to simplify the circuitry needed to produce time multiplexed samples of S signals. FIFOs are known in the art to operate such that values stored in memory are read out one at a time in the order they are stored into memory. The next value to be read out is said to be at the "top" of the memory. The value most recently stored in the FIFO is at the "bottom" of the memory.

In preparation for operation, the autoregressive coefficients for the first signal are applied on buses 132 and 134 from any known source. The autoregressive coefficients are then stored into memories $100_1 \ldots 100_4$ and $102_1 \ldots 102_4$. The autoregressive coefficients for the remaining S signals are then stored into memories $100_1 \ldots 100_4$ and $102_1 \ldots 102_4$ in like fashion. Memories $104_1 \ldots 104_4$ and $106_1 \ldots 106_4$ could be loaded with initial values in a like fashion. Here, however, the initial values are all zero, and well known methods may be employed to set all the values stored in a digital memory to zero.

In a first time interval, the values of autoregressive coefficients for the first signal are at the tops of memories $100_1 \ldots 100_4$ and $102_1 \ldots 102_4$. These are thus fed to computing circuitry 130 to compute a value of $y(N)$. After a value of $y(N)$ is computed for the first signal, the autoregressive coefficients at the tops of memories $100_1 \ldots 100_4$ and $102_1 \ldots 102_4$ are moved to the bottoms of the memories. The autoregressive coefficients for the second signal are thus at the tops of memories $100_1 \ldots$ $100_4$ and $102_1 \ldots 102_4$ to compute a value of y(N) for the second signal during the second interval.

When the autoregressive coefficients for the first signals are placed at the bottoms of memories $100_1 \ldots 100_4$ and $102_1 \ldots 102_4$, the past values of y(N) for the first signal are written to the bottoms of memories $104_1 \ldots 104_4$ and $106_1 \ldots 106_4$. After S time intervals, the autoregressive coefficients for the first coefficient will again be at the tops of memories $100_1 \ldots 100_4$ and $102_1 \ldots 102_4$. The past values of y(N) for the first signal will simultaneously be at the tops of memories $104_1 \ldots 104_4$ and $106_1 \ldots 106_4$.

In a like manner, the values needed to compute y(N) for the second signal are the tops of memories $100_1 \ldots 100_4, 102_1 \ldots 102_4, 104_1 \ldots 104_4$ and $106_1 \ldots 106_4$ during the second interval. These values are applied to computing circuitry 130 to produce a new value of y(N). The appropriate values are then written to the bottoms of the memories so they will next circulate to the tops of the memories in the same time interval.

The same pattern is repeated for all of the other S signals. Thus, use of FIFOs for memories as shown provides a simple circuit for producing time multiplexed samples of a plurality of signals.

Figure 2:
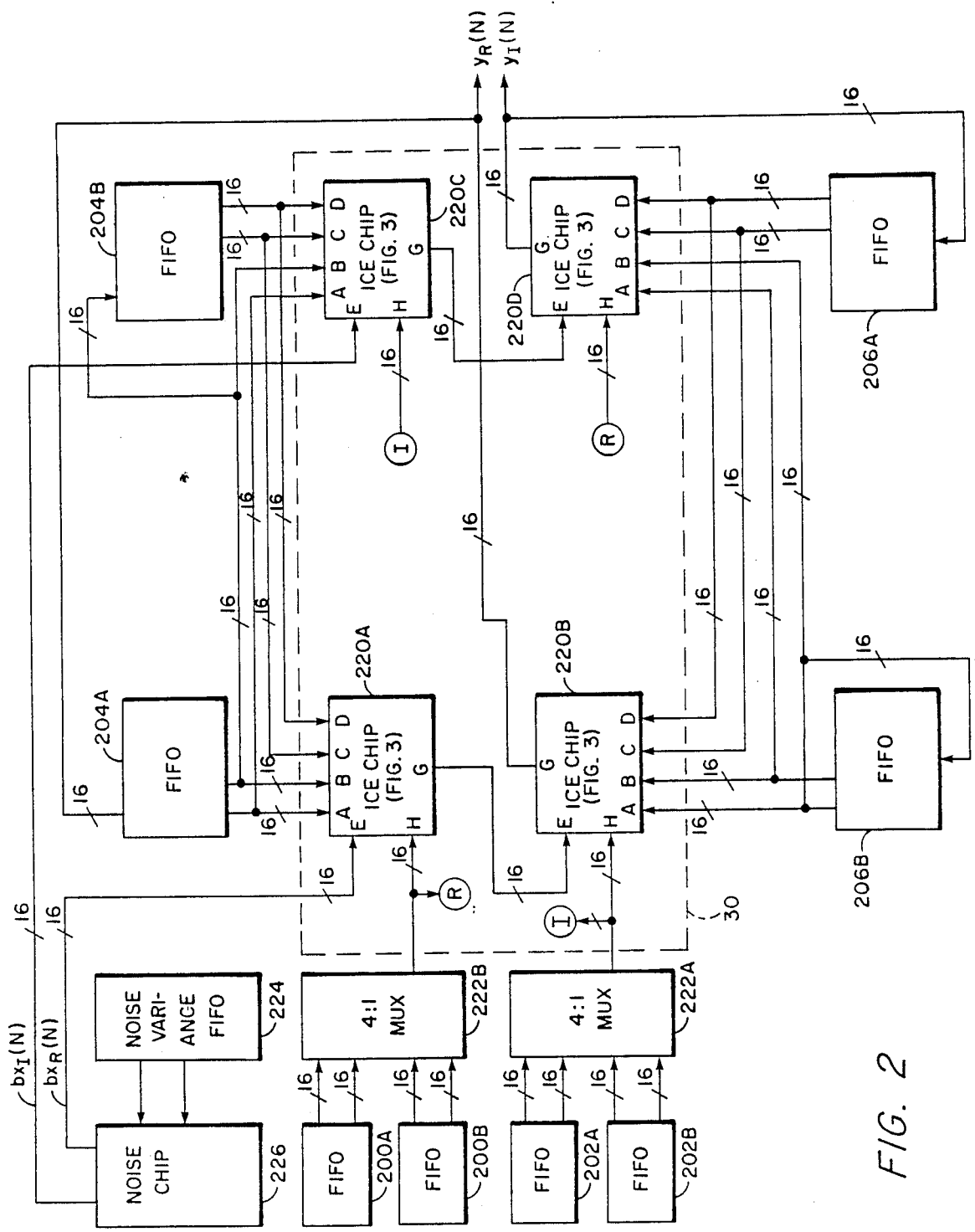
FIG. 2 is a circuit diagram, greatly simplified, of the autoregressive model simulator of FIG. 1 constructed from integrated circuits.

Turning now to FIG. 2, a circuit for implementing the autoregressive model simulator of FIG. 1 using integrated circuit chips is shown. Standard elements of digital circuits such as power connections and control signals are not explicitly shown. However, one of skill in the art will realize that such elements are required.

Computing circuit 130 is shown to comprise four identical chips 220A . . . 220D. Here, chips 220A . . . 220D are called Integer Computing Elements (ICE) chips and are explained in more detail below in conjunction with FIG. 3. Suffice it to say here that ICE chips 220A . . . 220D produce the outputs $y_R(N)$ and $y_I(N)$ described above.

FIFO 200A is a single integrated circuit chip (IC) containing two FIFO memories configured like memories $100_1$ and $100_2$ (FIG. 1). FIFO 200B implements memories $100_3$ and $100_4$ (FIG. 1). FIFO 202A implements memories $102_1$ and $102_2$ (FIG. 1). FIFO 202B implements memories $102_3$ and $102_4$ (FIG. 1). FIFO 204A implements memories $104_1$ and $104_2$ (FIG. 1). FIFO 204B implements memories $104_3$ and $104_4$ (FIG. 1). FIFO 206A implements memories $106_1$ and $106_2$ (FIG. 1). FIFO 206B implements memories $106_3$ and $106_4$. FIFOs 200A, 200B, 202A, 202B, 204A, 204B, 206A and 206B are each a separate IC such as are known in the art.

Multiplexers 222A and 222B are 4:1 multiplexers such as are known in the art. FIFOs 200A, 200B, 202A and 202B have two outputs (here each a digital word of 16 bits) each representing one autoregressive coefficient. As will be explained later, four 16 bit words are read into each ICE chip 220A . . . 220D. However, each ICE chip 220A . . . 220D has only one 16 bit input labeled H. Multiplexer 222A selects one of the four outputs at a time from FIFOs 200A and 200B for application to ICE chips 220A and 220D. Likewise, multiplexer 222A selects one of the four outputs at the time from FIFOs 202A and 202B for application to ICE chips 220B and 220C.

The inputs $bX_R(N)$ and $bX_I(N)$ are produced by noise chip 226. Here, noise chip could be one or a collection of chips using known techniques to generate digital samples of zero mean gaussian noise. Noise chip 226 takes as an input a parameter stored in noise variance FIFO 224. Noise variance FIFO 224 operates like one of the memories $100_1 \ldots 100_4$ (FIG. 1). Noise variance coefficients for each one of the S signals to be generated is stored in noise variance FIFO 224. The noise variance coefficients for each signal reaches the top of noise variance FIFO 224 in the same interval when the autoregressive coefficients for the same 15 signal reach the tops of memories $100_1 \ldots 100_4$. Noise chip 226 generates a sample of a random signal with desired variance. Thus, samples of the input bX(N) for the plurality of signals are generated in a time multiplexed order.

Figure 3:
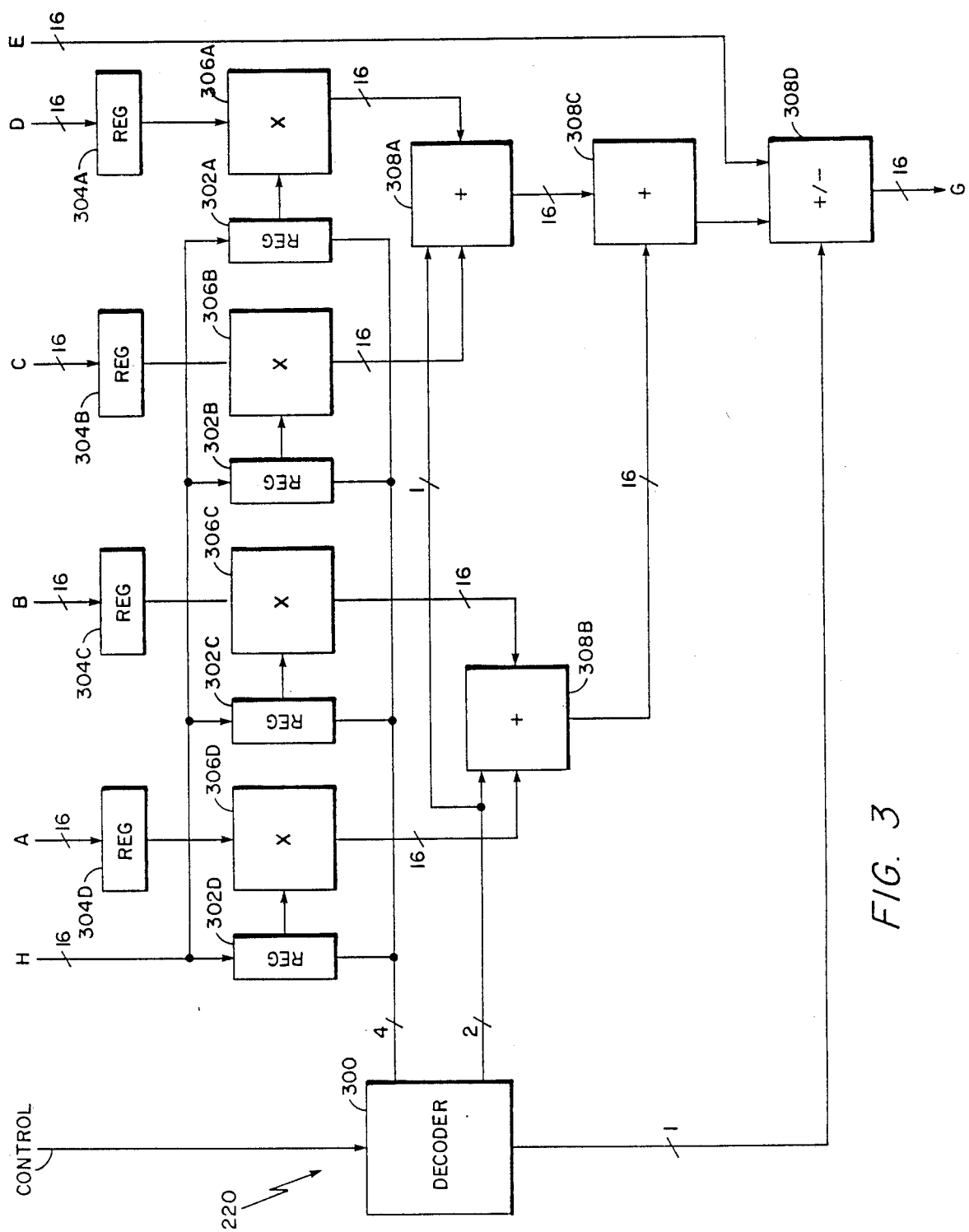
FIG. 3 is a block diagram of an Integer Computing Element (ICE) integrated circuit used in the circuit of FIG. 2.

FIG. 3 shows additional details of an ICE chip 220 representative of one of the ICE chips 220A . . . 220D. FIG. 3 shows a control input is applied to a decoder 300. Each output of decoder 300 is applied as a control signal to one of the elements of ICE chip 220. The control input is generated by a control circuit (not shown) which might contain a read only memory with the control inputs stored sequentially in it. One of skill in the art will recognize the control circuit (not shown) can be constructed in a variety of known ways to operate the ICE chips as described herein.

Inputs A, B, C and D are connected, as shown in FIG. 2 to one of the FIFOs 204A, 204B, 206A or 206B. Thus, one of the past values of the output y(N) are applied to inputs to A, B, C and D. That value is stored in one of the registers 304A, 304B, 304C or 304D.

As also shown in FIG. 2, the autoregressive coefficients stored in either FIFO 200A, 200B, 202A or 202B are applied to the H input of an ICE chip 220A . . . 220D via multiplexer 222A or 222B. As described above, multiplexers 222A and 222B apply the coefficients to input H sequentially such that each coefficient may be stored in one of the registers 302A . . . 302D.

Each of the multipliers 306A . . . 306D has as its inputs one past value of y(N) and one autoregressive coefficient. The outputs of multipliers 306A . . . 306D therefore make up four terms of one of the summations in Eqs. 2a and 2b. The outputs of multipliers 306A and 306B are summed by adder 308A. The outputs of multipliers 306C and 306D are summed by adders 308B. The output of adder 308A is applied to adder 308C. The output of adder 308B is applied as an input to adder 308C. The output of adder 308C represents the sum of all the products produced by multipliers 306A . . . 306D. In FIG. 1, the output of adder 308C corresponds to the output of adder 120, 121, 123 or 124, depending on which of the ICE chips 220A . . . 220D (FIG. 2) is represented by ICE chip 220 (FIG. 3).

The output of adder 308C is added to the input labeled E. As shown in FIG. 2, the input E represents the real part of the input $bX_R(N)$, the output of adder 120 (FIG. 1), the imaginary part of the input $bX_I(N)$ or the output of adder 123 (FIG. 1) depending on whether ICE chip 220 is used for ICE chip 220A, 220B, 220C or 220D, respectively. When ICE chip 220 is used for ICE chip 220B, the output of adder 308C must be subtracted from the input E. Adder 308D can be configured by control signal from decoder 300 to subtract. Thus, ICE chip 220 as shown in FIG. 3 is flexible enough to be used for any of the ICE chips 220A . . . 220D of FIG. 2.

Figure 4A:
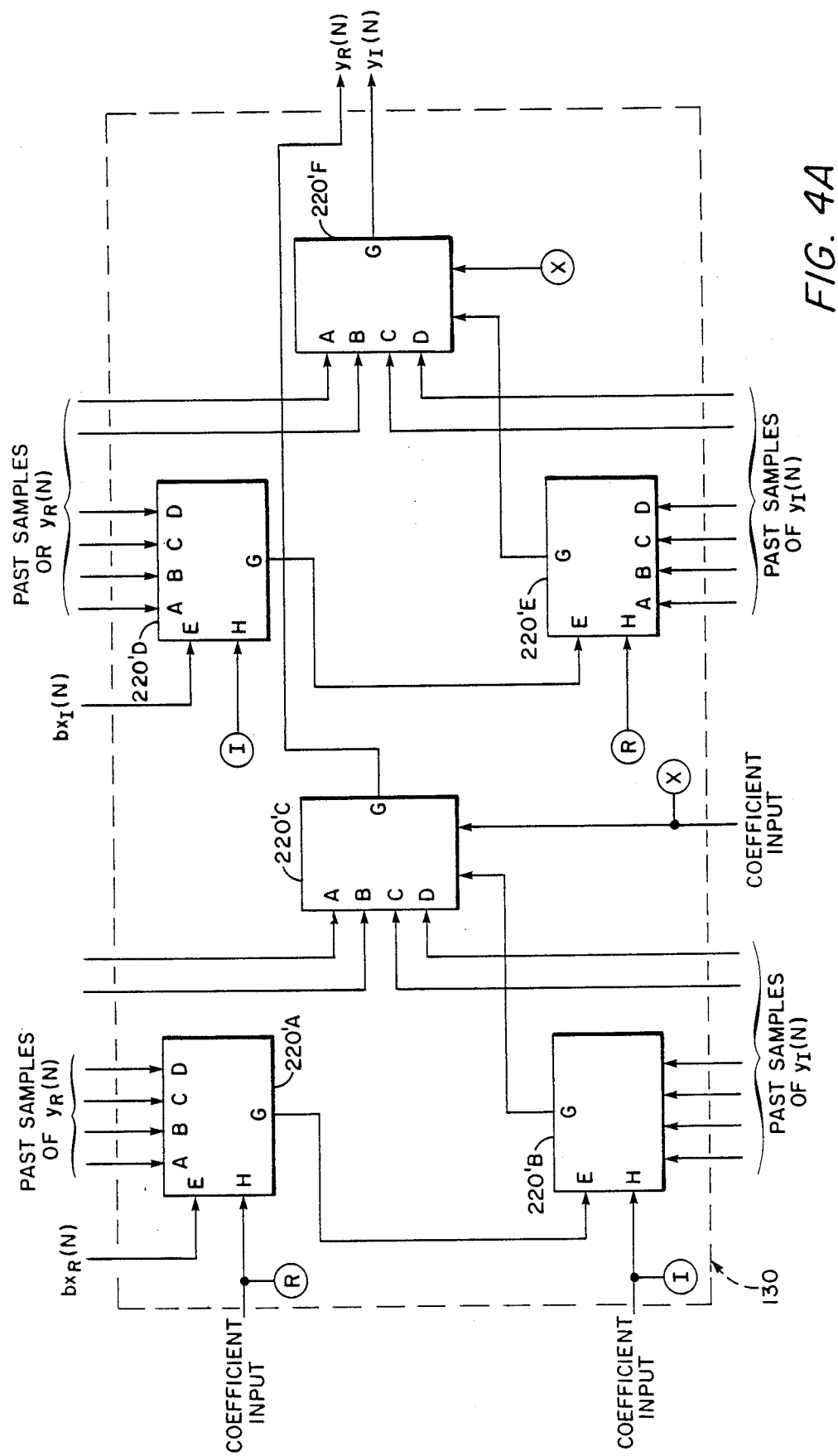
FIG. 4A is a block diagram of the computing circuitry of a sixth order autoregressive model simulator constructed with ICE chips according to the present invention.

ICE chip 220 might be used to provide an autoregressive model simulator of an order other than four as shown in FIGS. 1 and 2. FIG. 4a shows how a plurality of ICE chips 220'A . . . 220'F can be connected to make a sixth order autoregressive model simulator. FIG. 4A shows only the computing circuit 130. As previously described, computing circuit 130 is connected to memories storing autoregressive coefficients at the points labeled "coefficient input". The points labeled R, I and X are connected to like points designated R, I and X. The points labeled R are connected to a memory containing the real parts of the autoregressive coefficients. The points labeled I are connected to a memory containing the imaginary parts of the autoregressive coefficients. The points labeled X are connected to memories storing the real parts of two autoregressive coefficients and the imaginary parts of two autoregressive coefficients. Computing circuit 130 is also connected to memories storing past samples of $y_R(N)$ and $y_I(N)$ at the points indicated.

Figure 4B:
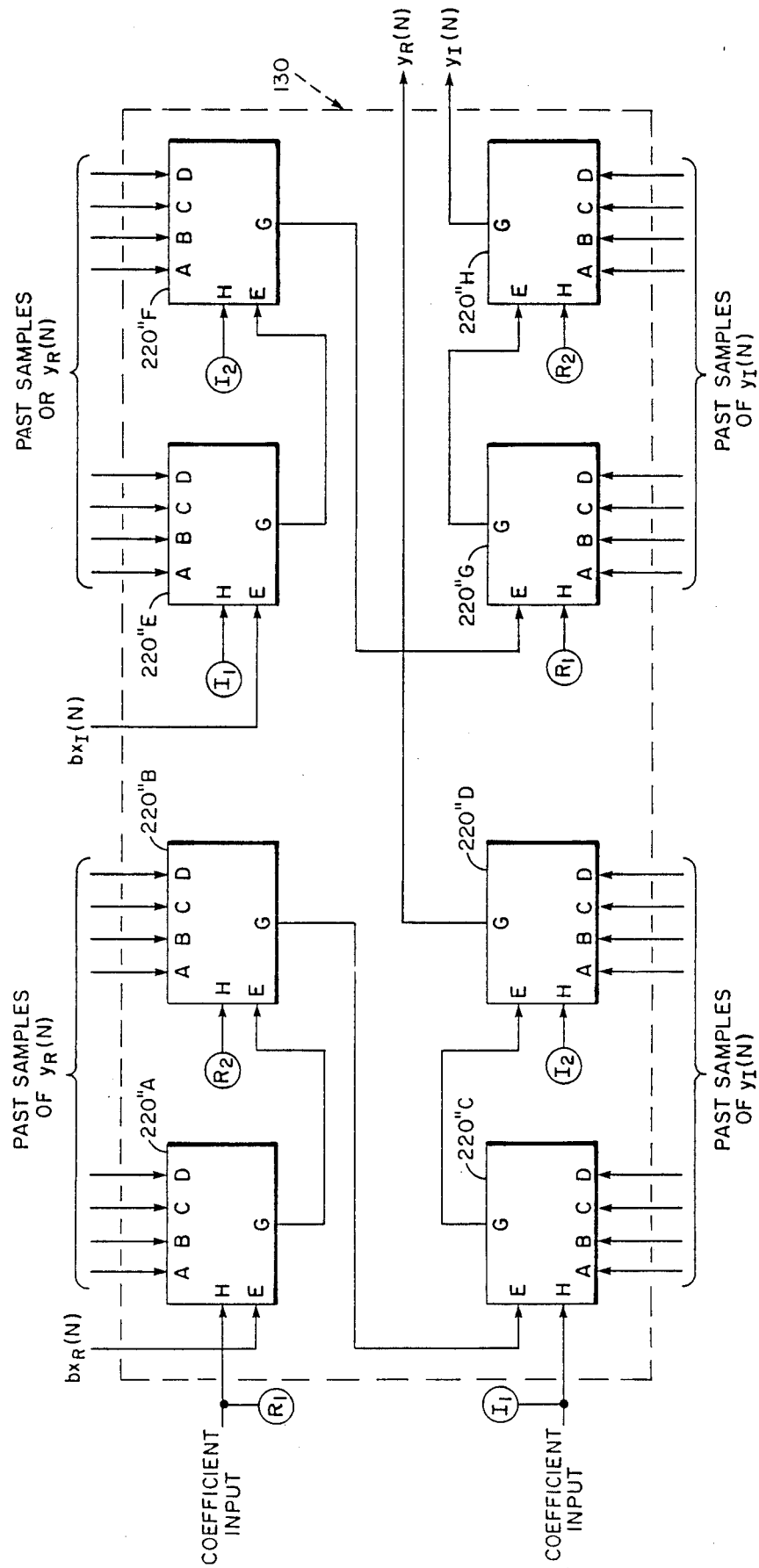
FIG. 4B is a block diagram of the computing circuitry of an eighth order autoregressive model simulator constructed with ICE chips according to the present invention.

In a similar fashion, FIG. 4B shows ICE chips 220"A . . . 220"H connected to form an eighth order autoregressive model simulator. As shown, computing circuit 130 is connected to memories storing past samples of $y_R(N)$ and $y_I(N)$. Computing circuit 130 is also connected to inputs $bX_R(N)$ and $bX_I(N)$. The circuit 130 is also connected to memories storing autoregressive coefficients. The points labeled $R_1$ and $R_2$ are each connected to memories storing one-half of the real parts of the coefficients. The points labeled $I_1$ and $I_2$ are each connected to memories storing one half of the imaginary parts of the coefficients.

Having described this invention, it will now be apparent to one of skill in the art that various modifications could be made to the disclosed embodiments. The ICE chips might be combined to form autoregressive model simulators of orders other than disclosed. The layouts of the ICE chips might be modified to include other numbers of multipliers and adders. It is felt, therefore, that this invention should not be restricted to the disclosed embodiments, but rather should be limited only by the spirit and scope of the appended claims.

What is claimed is:

1. The method of computing successive samples of a plurality of signals from a plurality of autoregressive coefficients, comprising the steps of:
   (a) storing autoregressive coefficients in a plurality of coefficient FIFO memories, said storing step including storing a value representing the real part of each autoregressive coefficient in a first FIFO memory and storing a value representing the imaginary part of the autoregressive coefficient in a second FIFO memory;
   (b) storing values representing previously computed samples of the computed signals in a plurality of signal FIFO memories;
   (c) computing a sample of one of the plurality of signals from the values at the tops of the coefficient FIFO memories and the signal FIFO memories;
   (d) moving the value at the top of each of the coefficient FIFO memories to the bottom of the same FIFO memory; and
   (e) storing a value representing the computed sample at the bottom of a first one of the plurality of signal FIFO memories and moving the values from the tops of each, except one, of the signal FIFO memories to the bottom of a different signal FIFO memory.

2. The method of claim 1 wherein the step of storing autoregressive coefficients comprises: storing a set of sequentially ordered autoregressive coefficients for each one of the plurality of signals with corresponding real parts of each autoregressive coefficient in each set being stored in the same FIFO.

3. An autoregressive mode simulator constructed from a plurality of circuit elements, each such circuit element having a plurality of inputs and an output, each such circuit element comprising:
   (a) a plurality of multipliers, each having two inputs and one output wherein one input of each multiplier is connected to one of the plurality of inputs of the circuit element;
   (b) at least one adder, each adder having two inputs and one output, with the inputs of each adder being coupled to the outputs of two of the plurality of multipliers; and
   (c) means for arithmetically combining two inputs to produce an output equalling the sum of the inputs when a control signal is in a first state and the difference of the inputs when the control signal is in a second state, with one of the inputs of the combining means coupled to the outputs of adders and the other of the inputs of the combining means connected to one of the plurality of inputs of the circuit element.

4. The autoregressive model simulator of claim 3 wherein the circuit element additionally comprises:
   (a) a plurality of registers, each storing a digital word wherein the word in each register is coupled to one input of the plurality of multipliers; and
   (b) means for loading each of the plurality of registers with values at one of the inputs to the circuit element.

5. The autoregressive model simulator of claim 4 wherein the outputs of the adders are coupled to the arithmetic combining means through at least one adder.

6. The autoregressive model simulator of claim 5 wherein:
   (a) the autoregressive model simulator computes a sample of an output signal using a fourth order autoregressive model;
   (b) the plurality of circuit elements comprises four circuit elements; and
   (c) the plurality of multipliers comprises four multipliers.

7. The autoregressive model simulator of claim 3 wherein the input of the arithmetic combining means of one circuit element comprises the output of another of the circuit elements.

8. The autoregressive model simulator of claim 7 wherein each circuit element is fabricated as one integrated circuit.

* * * * *